United States Patent
Kwon et al.

(10) Patent No.: US 8,873,301 B2
(45) Date of Patent: Oct. 28, 2014

(54) SEMICONDUCTOR MEMORY DEVICE AND METHOD OF OPERATING THE SAME

(71) Applicant: SK hynix Inc., Icheon-si (KR)

(72) Inventors: Tae Heui Kwon, Seoul (KR); Hwang Huh, Cheonju-si (KR)

(73) Assignee: SK Hynix Inc., Icheon-Si (KR)

( * ) Notice: Subject to any disclaimer, the term of this patent is extended or adjusted under 35 U.S.C. 154(b) by 24 days.

(21) Appl. No.: 13/717,310

(22) Filed: Dec. 17, 2012

(65) Prior Publication Data

US 2014/0064002 A1    Mar. 6, 2014

(30) Foreign Application Priority Data

Aug. 30, 2012   (KR) .................. 10-2012-0095683

(51) Int. Cl.
  *G11C 16/06* (2006.01)
  *G11C 7/12* (2006.01)
  *G11C 16/16* (2006.01)
  *G11C 16/24* (2006.01)

(52) U.S. Cl.
  CPC G11C 7/12 (2013.01); G11C 16/16 (2013.01); G11C 16/24 (2013.01)
  USPC ..................... 365/185.25; 365/203

(58) Field of Classification Search
  CPC ........... G11C 16/24; G11C 16/10; G11C 7/12
  USPC .............................................. 365/185.25, 203
  See application file for complete search history.

(56) References Cited

U.S. PATENT DOCUMENTS 8,488,382 B1 *   7/2013   Li et al. ..................... 365/185.17
8,619,476 B2 *  12/2013   Chu ........................... 365/185.21

FOREIGN PATENT DOCUMENTS

KR          100763078 B1     9/2007

* cited by examiner

*Primary Examiner* — Huan Hoang
(74) *Attorney, Agent, or Firm* — Haynes and Boone, LLP

(57) ABSTRACT

A semiconductor memory device and a method of manufacturing the same are provided. The device includes a memory block and one or more peripheral circuits. The memory block includes a bit line, a common source line, a vertical channel layer coupled between the bit line and the common source line, word lines surrounding the bit line at different heights from a semiconductor substrate, and memory cells formed in portions where the word lines surround the vertical channel layer. The one or more peripheral circuits are configured to set the word lines to a floating state to supply holes to the vertical channel layer when a precharge voltage is applied to the common source line, and set word lines of memory cells to be erased to a ground state when an erase voltage is applied to the common source line.

21 Claims, 9 Drawing Sheets

SEMICONDUCTOR MEMORY DEVICE AND METHOD OF OPERATING THE SAME

CROSS-REFERENCE TO RELATED APPLICATION

This application claims priority to and the benefit of Korean Patent Application No. 10-2012-0095683, filed Aug. 30, 2012, the disclosure of which is incorporated herein by reference in its entirety.

BACKGROUND

The present disclosure relates to a semiconductor memory device and a method of operating the same. More specifically, embodiments disclosed herein relate to a semiconductor memory device and a method of operating the same, which are associated with a data erase operation.

A semiconductor memory device may include a memory array. The memory array may include a plurality of memory cells, which may be classified in block units. That is, the size of a memory block may depend on the number of memory cells included in the memory block. If the semiconductor memory device is a non-volatile memory device, an erase operation may be performed in units of memory blocks.

However, when the number of memory cells in a semiconductor memory device is increased to obtain a high integration density, the number of memory cells included in a memory block may also increase, thus, increasing the size of the memory block. However, since the size of the memory block that may be controlled by a memory controller is fixed, when the size of the memory block increases, the compatibility of the memory block with the memory controller may become problematic.

BRIEF SUMMARY

Embodiments disclosed herein describe a semiconductor memory device and a method of operating the same, by which a logical size of a memory block as an operation target may be controlled.

Consistent with some embodiments, there is provided a semiconductor memory device. The semiconductor memory device includes a memory block and one or more peripheral circuits. The memory block includes a bit line, a common source line, a vertical channel layer coupled between the bit line and the common source line, word lines surrounding the bit line at different heights from a semiconductor substrate, and memory cells formed in portions where the word lines surround the vertical channel layer. The one or more peripheral circuits are configured to set the word lines to a floating state to supply holes to the vertical channel layer when a precharge voltage is applied to the common source line, and set word lines of memory cells to be erased to a ground state when an erase voltage is applied to the common source line.

Consistent with some embodiments, there is also provided a method of operating a semiconductor memory device. The method includes applying an erase command signal and an address signal for erasing selected memory cells out of a plurality of memory cells, the plurality of memory cells being defined by word lines surrounding a vertical channel layer coupled between a bit line and a common source line at different heights from a semiconductor substrate, applying a precharge voltage to the common source line to supply holes to the vertical channel layer, setting selected word lines of memory cells to be erased to a ground state, and applying an erase voltage to the common source line.

BRIEF DESCRIPTION OF THE DRAWINGS

The above and other features and advantages will become more apparent to those of ordinary skill in the art by describing in detail exemplary embodiments thereof with reference to the attached drawings in which.

DETAILED DESCRIPTION OF EMBODIMENTS

In the following description specific details are set forth describing certain embodiments. It will be apparent, however, to one skilled in the art that the disclosed embodiments may be practiced without some or all of these specific details. The specific embodiments presented are meant to be illustrative, but not limiting. One skilled in the art may realize other material that, although not specifically described herein, is within the scope and spirit of this disclosure.

Figure 1:
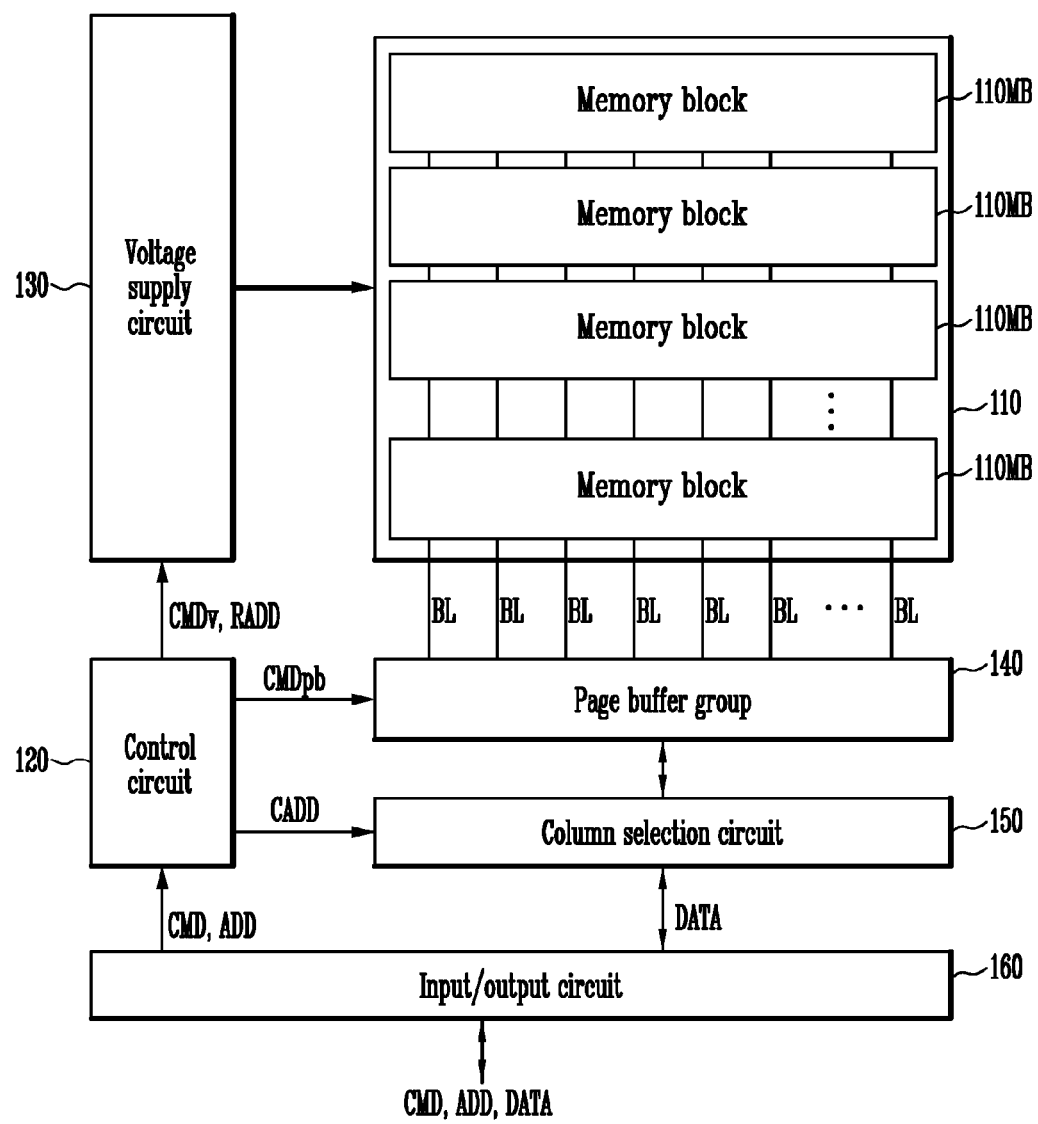
FIG. 1 is a block diagram of a semiconductor memory device according to some embodiments.
Figure 2A:
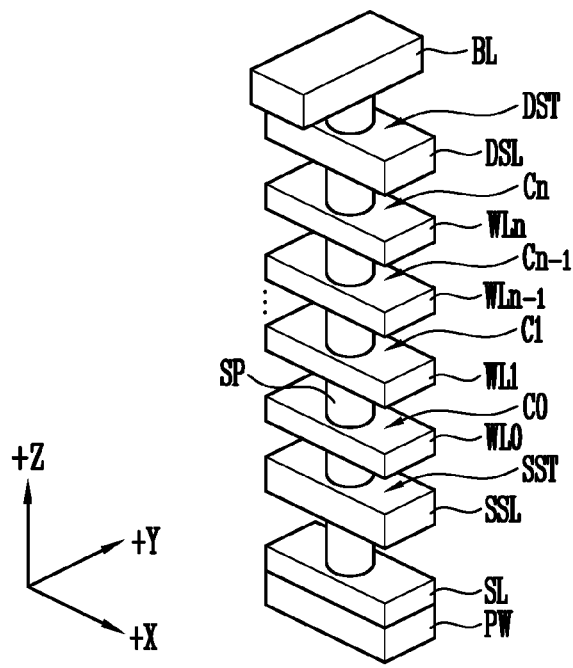
FIGS. 2A and 2B are diagrams for explaining the memory block of FIG. 1, according to some embodiments.
Figure 2B:
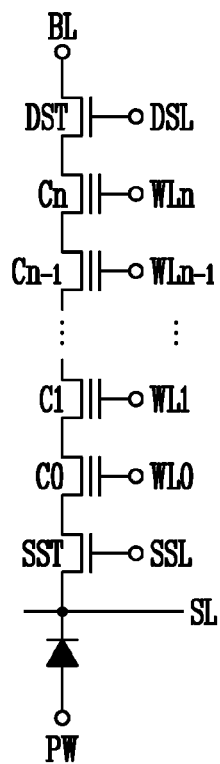
Figure 3A:
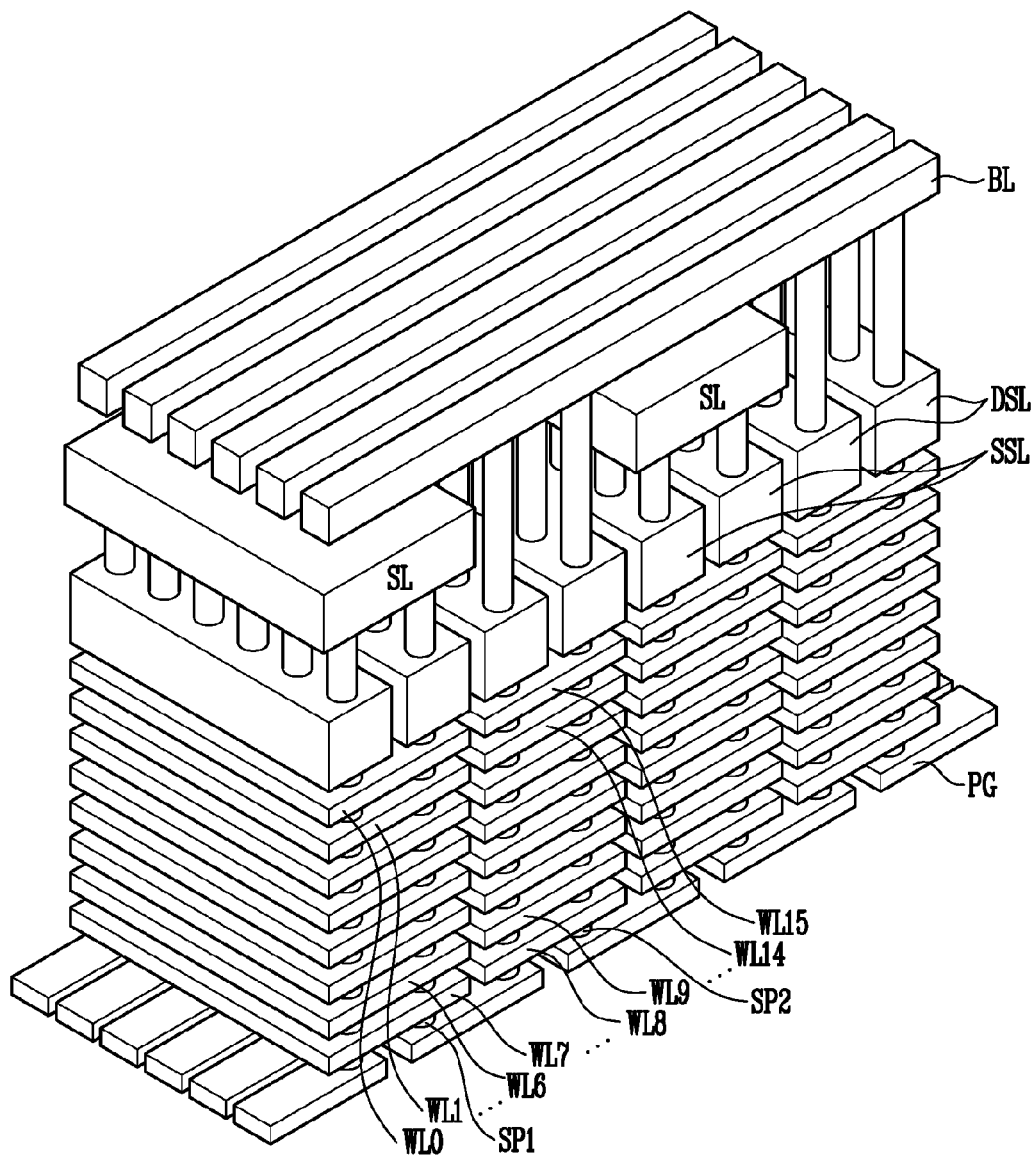
FIGS. 3A and 3B are diagrams for explaining the memory block of FIG. 1, according to some embodiments.
Figure 3B:
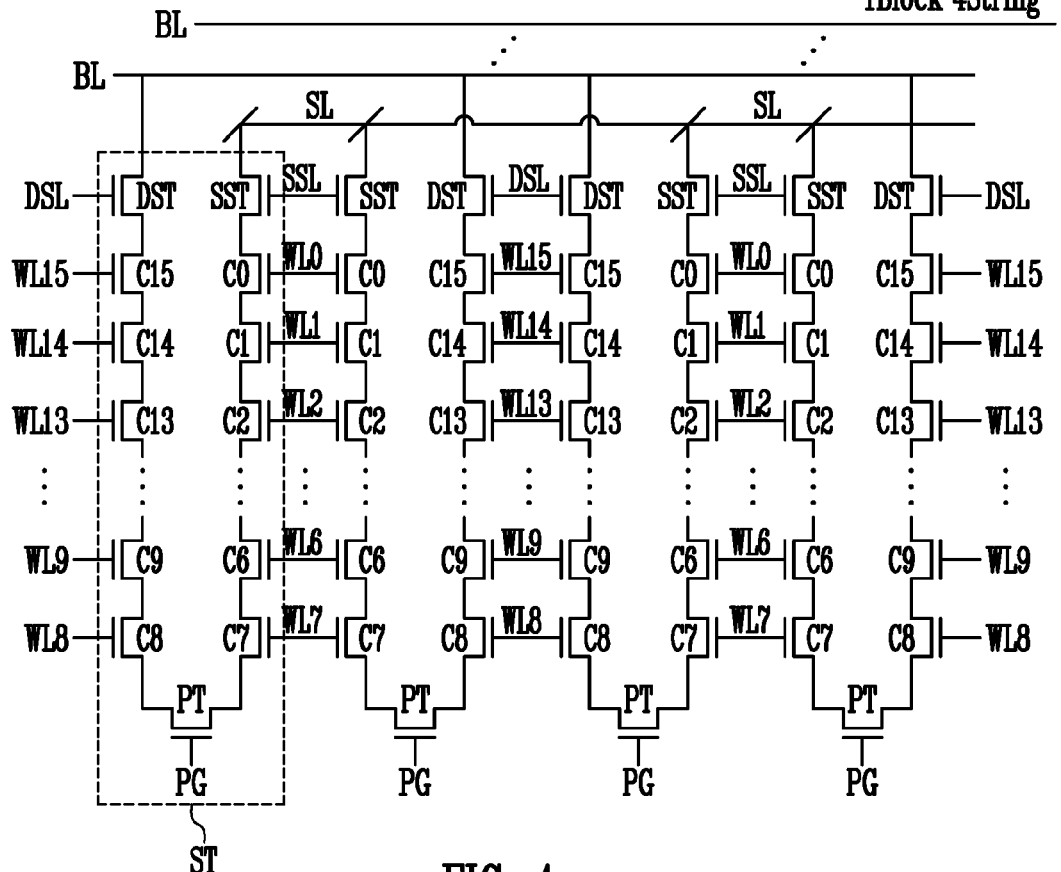

FIG. 1 is a block diagram of a semiconductor memory device according to some embodiments, FIGS. 2A and 2B are diagrams for explaining the memory block of FIG. 1, and FIGS. 3A and 3B are diagrams for explaining the memory block of FIG. 1.

Referring to FIG. 1, the semiconductor memory device may include a memory array 110 and a peripheral circuits that includes circuits 120, 130, 140, 150, and 160. The peripheral circuit may include a control circuit 120 and operation circuits 130, 140, 150, and 160. According to some embodiments, in particular when the semiconductor memory device illustrated in FIGS. 1, 2A, 2B, 3A, and 3B correspond to a flash memory device, the operation circuits may include a voltage supply circuit 130, a page buffer group 140, a column selection circuit 150, and an input/output (I/O) circuit 160.

The memory array 110 may include a plurality of memory blocks 110MB. Each of the memory blocks 110MB may include a plurality of memory strings.

FIG. 2A is a perspective view of a memory block 110MB of FIG. 1, and FIG. 2B is an equivalent circuit diagram of the perspective view shown in FIG. 2A.

Referring to FIGS. 2A and 2B, a source line SL may be formed on a semiconductor substrate (not shown) having a p-well PW. A vertical channel layer SP may be formed on the source line SL. An upper portion of the vertical channel layer SP may be connected to a bit line BL. The vertical channel layer SP may be formed of polysilicon (poly-Si). A plurality of conductive layers SSL, WL0 to WLn, and DSL may be formed to surround the vertical channel layer SP at different heights from the semiconductor substrate. A multilayered structure (not shown) including a charge storage layer may be formed on the surface of the vertical channel layer SP and interposed between the vertical channel layer SP and the conductive layers SSL, WL0~WLn, and DSL.

A lowermost conductive layer may be a source select line SSL, and an uppermost conductive layer may be a drain select line DSL. Conductive layers between the select lines SSL and DSL may be word lines WL0 to WLn. The drain select line DSL may surround an upper end portion of the vertical channel layer SP, while the source select line SSL may surround a lower end portion of the vertical channel layer SP. In other words, a plurality of conductive layers SSL, WL0 to WLn, and DSL may be formed at different layers on the semiconductor substrate, and the vertical channel layer SP may penetrate the conductive layers SSL, WL0 to WLn, and DSL and be vertically connected between the bit line BL and the source line SL formed on the semiconductor substrate.

A drain select transistor DST may be formed at a portion where the uppermost conductive layer DSL surrounds the vertical channel layer SP, and a source select transistor SST may be formed at a portion where the lowermost conductive layer SSL surrounds the vertical channel layer SP. Memory cells C0 to Cn may be formed at portions where middle conductive layers WL0 to WLn surround the vertical channel layer SP.

Due to the above-described structure, a memory string may include the source select transistor SST, the memory cells C0 to Cn, and the drain select transistor DST, which may be vertically connected to the substrate between the source line SL and the bit line BL. The above-described memory string may be referred to as a Bit Cost Scalable (BiCS) structure.

The above-described structure may be the memory string, and a plurality of memory strings may be included in the memory block. A memory block having a different structure will now be described.

FIG. 3A is a perspective view of the memory block of FIG. 1, and FIG. 3B is an equivalent circuit diagram of the perspective view shown in FIG. 3A.

Referring to FIGS. 3A and 3B, a pipe gate PG may be formed on a semiconductor substrate (not shown), and a horizontal channel layer (not shown) may be formed in the pipe gate PG. Vertical channel layers SP1 and SP2 may be formed at both ends of the horizontal channel layer. An upper portion of a first vertical channel layer SP1 of a pair of vertical channel layers may be connected to a source line SL, and an upper portion of a second vertical channel layer SP2 thereof may be connected to a bit line BL. The vertical channel layers SP1 and SP2 may be formed of poly-Si.

A plurality of conductive layers WL0 to WL7 and SSL may be formed to surround the first vertical channel layer SP1 at different heights from the semiconductor substrate. Also, a plurality of conductive layers WL8 to WL15 and DSL may be formed to surround the second vertical channel layer SP2 at different heights from the semiconductor substrate. A multilayered structure (not shown) including a charge storage layer may be formed on the surfaces of the vertical channel layers SP1 and SP2 and the surface of the horizontal channel layer. Also, the multilayered structure may also be disposed between the vertical channel layers SP1 and SP2 and the conductive layers SSL, WL0 to WL15, and DSL, and between the channel supply layer and the pipe gate PG.

An uppermost conductive layer surrounding an upper end portion of the first vertical channel layer SP1 may be a source select line SSL, and conductive layers disposed under the source select line SSL may be word lines WL0 to WL7. An uppermost conductive layer surrounding an upper end portion of the second vertical channel layer SP2 may be a drain select line DSL, and conductive layers disposed under the drain select line DSL may be word lines WL8 to WL15.

In other words, pairs of conductive layers SSL, WL0 to WL15, and DSL may be stacked on different layers on the semiconductor substrate, and the first vertical channel layer SP1 may penetrate the conductive layers SSL and WL0 to WL7 and be vertically connected between one end portion of the horizontal channel layer formed in the pipe gate PG and the source line SL. The second vertical channel layer SP2 may penetrate the conductive layers DSL and WL8 to WL15 and be vertically connected between the other end portion of the horizontal channel layer formed in the pipe gate PG and the bit line BL.

A source select transistor SST may be formed at a portion where the uppermost conductive layer SSL surrounds the first vertical channel layer SP1, and memory cells C0 to C7 may be formed in portions where the remaining conductive layers WL0 to WL7 surround the first vertical channel layer SP1. A drain select transistor DST may be formed in a portion where the uppermost conductive layer DSL surrounds the second vertical channel layer SP2, and memory cells C8 to C15 may be formed in portions where the remaining conductive layers WL8 to WL15 surround the second vertical channel layer SP2.

A memory string having the structure described above may include the source select transistor SST and the memory cells C0 to C7, which may be vertically connected to the substrate between the source line SL and the horizontal channel layer, and the drain select transistor DST and the memory cells C8 to C15, which may be vertically connected to the substrate between the bit line BL and a pipe channel layer PC. The above-described memory string may be referred to as a pipe-shaped BiCS or P-BiCS structure.

In the memory block, four memory strings ST may be connected to each of bit lines BL, and the number of memory strings ST connected to each of the bit lines BL may be changed. Connection or disconnection of the respective strings ST with or from the corresponding bit line BL may be controlled by different drain select lines DSL.

Referring to FIGS. 1 and 3B, the peripheral circuits 120 to 160 may be configured to perform an erase loop, program loop, and read operation of memory cells connected to a select word line. The peripheral circuits 120 to 160 may include the control circuit 120 configured to control the program loop, the read operation, and the erase loop, and the operation circuits 130 to 160 configured to perform the program loop, the read operation, and the erase loop under the control of the control circuit 120. The program loop may include a program operation and a program verification operation and be performed using an increment step plus program (ISPP) method. The erase loop may include an erase operation and an erase verification operation and be performed using an increment step plus erase (ISPE) method. To perform the program loop, the read operation, and the erase loop, the operation circuits 130 to 160 may be configured to selectively output a program voltage, a read voltage, an erase voltage, a pass voltage, a verification voltage, a source voltage, a drain select voltage, a source select voltage, a pipe gate voltage, and a bit line voltage to local lines DSL, WL0 to WL15, SSL, PG, and SL and bit lines BL of a selected memory block under the control of the control circuit 120, and control precharge/discharge operations of the bit lines BL, or sense voltages or currents of the bit lines BL. Consistent with embodiments wherein the semiconductor memory device corresponds to a NAND flash memory device, the operation circuits may include a voltage supply circuit 130, page buffer groups 140, a column selection circuit 150, and an I/O circuit 160.

The control circuit 120 may output a control signal CMDv for controlling the voltage supply circuit 130 in response to a command signal CMD externally input through the I/O circuit 160 such that operation voltages required to perform the program loop, the read operation, or the erase loop are generated at desired levels. The control circuit 120 may also output PB control signals CMDpb for controlling page buffers (not shown) included in the page buffer group 140 to perform the program loop, the read operation, or the erase loop. Furthermore, when an address signal ADD is applied to the control circuit 120, the control circuit 120 may output a row address signal RADD to the voltage supply circuit 130, and a column address signal CADD to the column selection circuit 150 in response to the address signal ADD.

The voltage supply circuit 130 may generate required operation voltages according to the program loop, the read operation, or the erase loop of memory cells in response to the voltage control signal CMDv of the control circuit 120, and output the operation voltages to the local lines SSL, WL0 to WLn, DSL, and PG, and a common source line SL of the selected memory block in response to the row address signal RADD.

Each of the page buffer groups 140 may include a plurality of page buffers (not shown) connected to the memory array 110 through the bit lines BL. During the program operation, the page buffers may selectively precharge the bit lines BL based on the PB control signal CMDpb of the control circuit 120 and data DATA to be stored in the memory cells. During the program verification operation or the read operation, the page buffers may precharge the bit lines BL, sense voltage variations or currents of the bit lines BL, and latch data read from the memory cells in response to the PB control signal CMDpb of the control circuit 120.

The column selection circuit 150 may select page buffers included in the page buffer group 140 in response to the column address CADD output by the control circuit 120. That is, the column selection circuit 150 may sequentially transmit data to be stored in the memory cells to the page buffers in response to the column address CADD. Also, the column selection circuit 150 may sequentially select the page buffers in response to the column address CADD such that the data of the memory cells, which is latched by the page buffers due to the read operation, are externally output.

The I/O circuit 160 may transmit the externally input command signal CMD and the address signal ADD to the control circuit 120. Also, the I/O circuit 170 may transmit externally input data DATA to the column selection circuit 150 during the program operation, or externally output the data read from the memory cells during the read operation.

Figure 4:
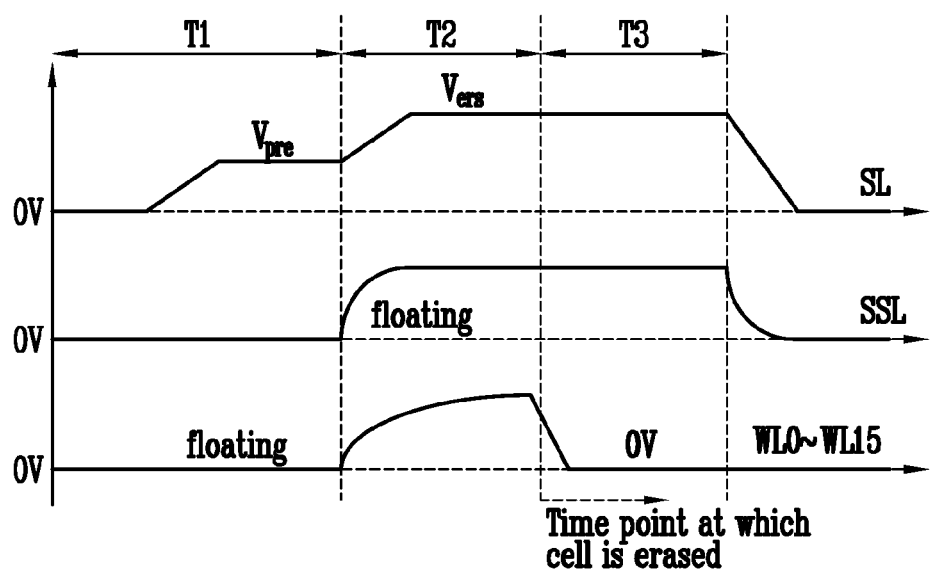
FIG. 4 is a signal waveform diagram illustrating an operation of a semiconductor memory device according to some embodiments.

FIG. 4 is a signal waveform diagram illustrating an operation of a semiconductor memory device according to some embodiments.

Referring to FIGS. 3B and 4, an erase command signal and an address signal may be input to erase memory cells of a selected memory block. In response to the erase command signal and the address signal, an operation of supplying holes to a vertical channel layer may be performed during a first time period T1. To this end, peripheral circuits 120 to 140 may set word lines WL0 to WL16 to a floating state and apply a precharge voltage $V_{pre}$ to a common source line SL. In particular, peripheral circuit including circuits 120 to 140 may firstly set the word lines WL0 to WL15 to the floating state and then apply the precharge voltage $V_{pre}$ to the common source line SL. A ground voltage may be applied to a source select line SSL by peripheral circuits 120 to 140, so a source select transistor SST may be turned off. Holes may be generated in the source select transistor SST due to a gate induced drain leakage (GIDL) current, and transported to the vertical channel layer.

When sufficient holes are supplied to the vertical channel layer, during a second time period T2, peripheral circuits 120 to 140 may set the source select line SSL to a floating state, and apply an erase voltage $V_{ers}$ to the common source line SL. Voltages of the source select lines SSL and the word lines WL0 to WL15, which are set to the floating gate, may rise to a level that is approximate to the erase voltage $V_{ers}$, due to a coupling effect. When the erase voltage $V_{ers}$ is applied to the common source line SL with the source select line SSL maintained at a ground level, the source select transistor SST may be damaged or fail due to a high voltage difference between a gate and a source. Accordingly, when a gate of the source select transistor SST is set to a floating state, a voltage of the gate may also rise with the application of the erase voltage $V_{ers}$ due to a coupling effect. Thus, a voltage difference between the gate and the source may be maintained low, thereby preventing destruction of the source select transistor SST.

During a third time period T3, the peripheral circuits 120 to 140 may apply a ground voltage to the floated word lines WL0 to WL15. As a result, the holes supplied to the vertical channel layer may be combined with electrons injected into memory cells due to a voltage difference between the erase voltage $V_{ers}$ and the ground voltage, so threshold voltages of the memory cells may drop, and the memory cells may be erased.

In the memory block shown in FIG. 3B, the number of word lines stacked should be increased to form a larger number of memory cells in the same region. As the number of stacked word lines increases, the number of memory cells included in the memory block may increase, and the size of the memory block may also increase. However, since the size of the memory block that may be controlled by the memory controller is limited, when the size of the memory block exceeds the limit, compatibility between the memory controller and the memory device may be problematic.

Figure 5A:
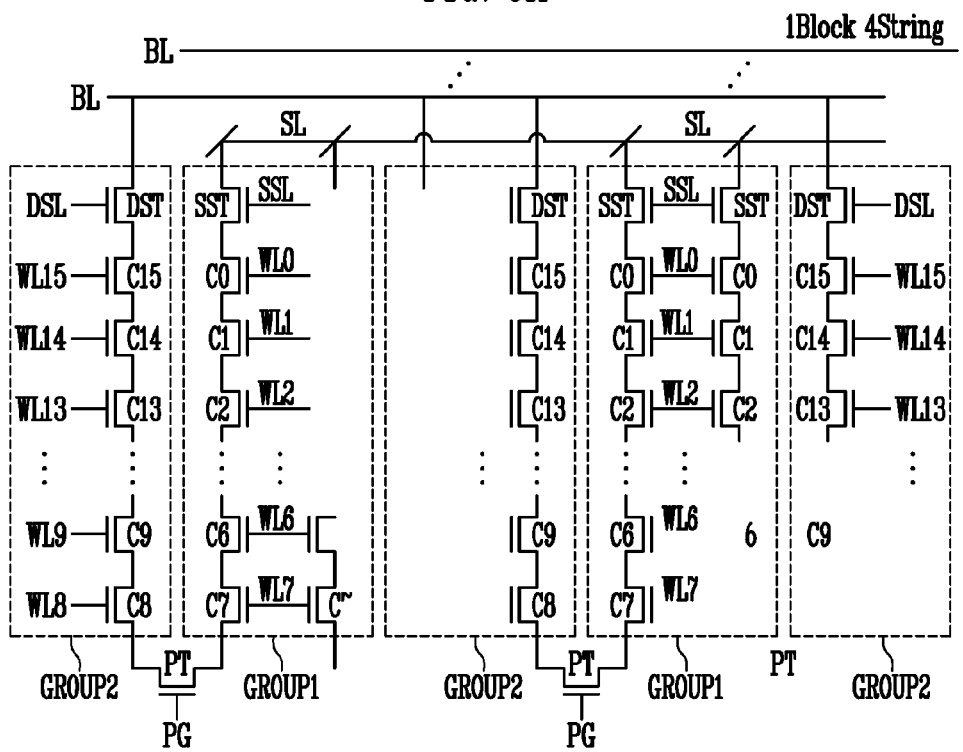
FIGS. 5A and 5B are diagrams illustrating an operation of a semiconductor memory device according to some embodiments.
Figure 5B:
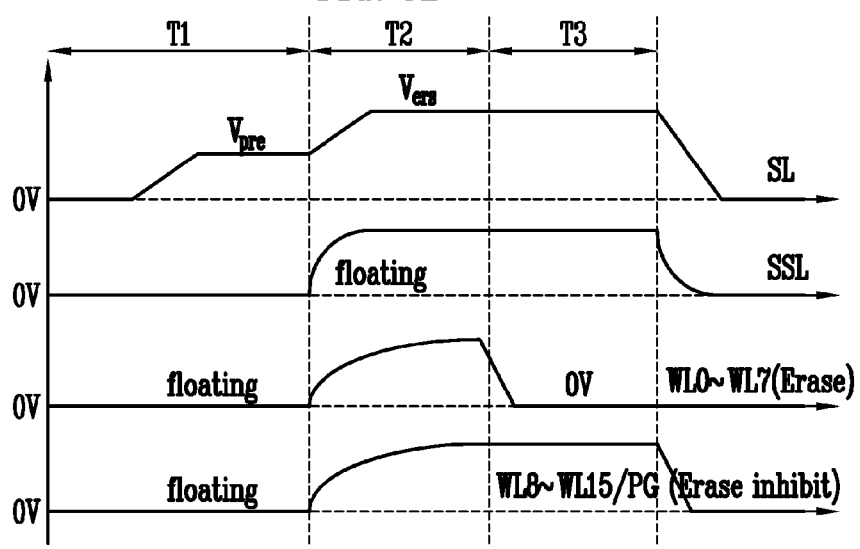
Figure 6:
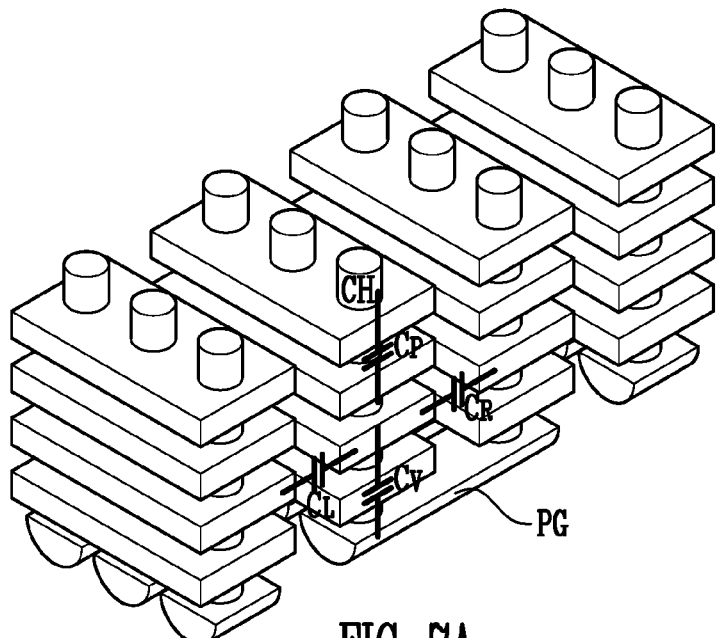
FIG. 6 is a diagram for explaining a parasitic capacitor caused between word lines as shown in FIG. 3A.

FIGS. 5A and 5B are diagrams illustrating an operation of a semiconductor memory device according to some embodiments, and FIG. 6 is a diagram for explaining a parasitic capacitor caused between word lines as shown in FIG. 3A. Consistent with some embodiments, FIGS. 5A, 5B and 6 demonstrate a method of controlling a logical size of the memory block as an operation target to solve compatibility between the memory controller and the memory device.

Referring to FIGS. 5A and 5B, memory cells C0 to C7 connected to lower word lines WL0 to WL7 out of word lines WL0 to WL15, may be defined as a first cell group GROUP1, while memory cells C8 to C15 connected to upper word lines WL8 to WL15 out of the word lines WL0 to WL15, may be defined as a second cell group GROUP2. That is, the memory cells C0 to C7 connected between a pipe transistor PT and a common source line SL may be defined as the first cell group GROUP1, while the memory cells C8 to C15 connected between the pipe transistor PT and a bit line BL may be defined as the second cell group GROUP2. Furthermore, by selecting the memory cells C0 to C7 of the first cell group GROUP1 or the memory cells C8 to C15 of the second cell group GROUP2 during an erase operation, the size of a memory block as an operation target may be logically reduced by half.

To erase memory cells of a selected memory block, an erase command signal and an address signal may be applied. In response to the erase command signal and the address signal, an operation of supplying holes to the vertical channel layer may be performed during a first time period T1. The first time period T1 may be performed in the same manner as the first time period T1 described with reference to FIG. 4. However, a gate of the pipe transistor PT may be set to a floating gate by the peripheral circuit 120 to 140.

When sufficient holes are supplied to the vertical channel layer, peripheral circuits 120 to 140 may set a source select line SSL to a floating state, and apply an erase voltage $V_{ers}$ to a common source line SL during a second time period T2. The second time period T2 may be performed in the same manner as the second time period T2 described with reference to FIG. 4.

When the memory cells C0 to C7 of the first cell group GROUP1 are designated as cells to be erased in response to the address signal, during a third time period T3, peripheral circuits 120 to 140 may apply a ground voltage to the word lines WL0 to WL7 of the selected first cell group GROUP1, out of the floated word lines WL0 to WL15, and maintain the word lines WL8 to WL15 of the unselected second cell group GROUP2 in a floating state. As a result, holes supplied to the vertical channel layer may be combined with electrons injected into the memory cells C0 to C7 of the first cell group GROUP1 due to a voltage difference between the erase voltage $V_{ers}$ and the ground voltage so that threshold voltages of the memory cells C0 to C7 may be reduced, and the memory cells C0 to C7 may be erased. In this case, since the word lines WL8 to WL15 are maintained floated, voltages of the word lines WL8 to WL15 may also rise due to a coupling effect during the application of the erase voltage $V_{ers}$, so differences between the voltages of the word lines WL8 to WL15 and the erase voltage $V_{ers}$ may not increase. Accordingly, the memory cells C8 to C15 of the second cell group GROUP2 may not be erased. Consequently, by controlling the logical size of a memory block as an operation target to be half the physical size, compatibility between the memory controller and the memory device may be improved for larger memory blocks.

However, due to a parasitic capacitance between the word lines WL0 to WL7 of the first cell group GROUP1 and the word lines WL8 to WL15 of the second cell group GROUP2, when the word lines WL0 to WL7 are changed from the floating state into the ground state, voltages of the floated word lines WL may be reduced. When the voltages of the word lines WL8 to WL15 are reduced, the unselected cells C8 to C15 may be erased.

However, referring to FIG. 6, since lateral parasitic capacitances $C_L$ and $C_R$ between word lines disposed opposite and adjacent to each other in the same layer are actually very low, erasure interference due to the lateral parasitic capacitances $C_L$ and $C_R$ may be neglected. Rather, although parasitic capacitances $C_P$ and $C_V$ caused by word lines disposed vertically adjacent to each other are relatively high, memory cells connected to the word lines disposed vertically adjacent to each other should be erased together during a half block erase operation so that erasure interference due to the parasitic capacitances $C_P$ and $C_V$ may be neglected.

Referring to Table 1, it can be seen that a capacitance between a word line and a channel is highest, and a lateral parasitic capacitance is lowest.

TABLE 1

|  | WL to Channel Cap | $C_V$ | $C_P$ | $C_R$ | $C_L$ | Total Cap |
|---|---|---|---|---|---|---|
| Amount of Cap (fF) | 0.023 | 0.018 | 0.018 | 0.005 | 0.005 | 0.069 |

Meanwhile, during the half block erase operation, since a pipe gate PG is formed between lowermost word lines WL7 and WL8, when the memory cell C7 of the word line WL7 is erased, the pipe gate PG may alleviate erasure interference caused in the memory cell C8 of the word line WL8.

Figure 7A:
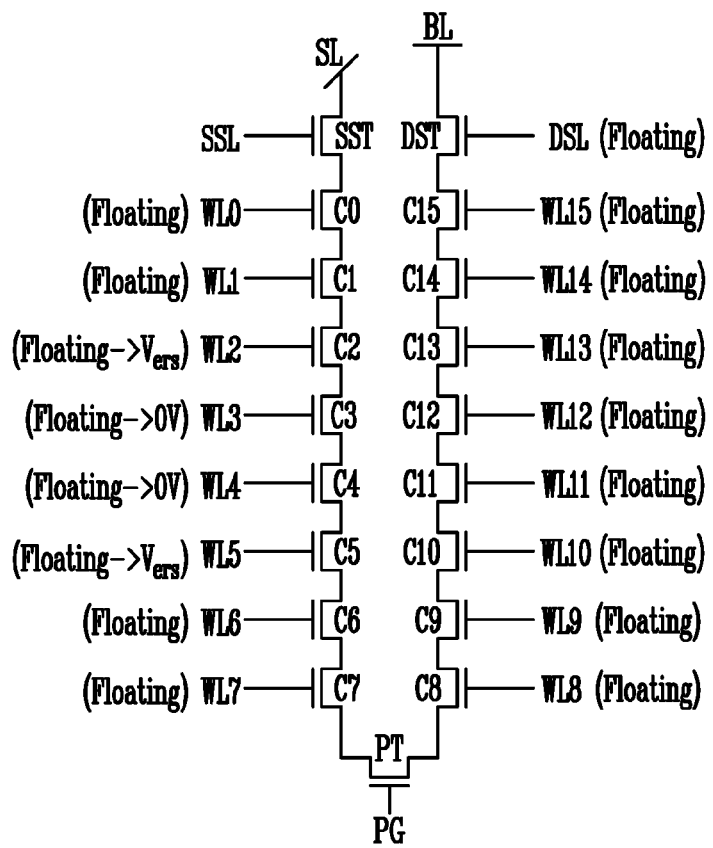
FIGS. 7A and 7B are diagrams for explaining an operation of a semiconductor memory device according to some embodiments.
Figure 7B:
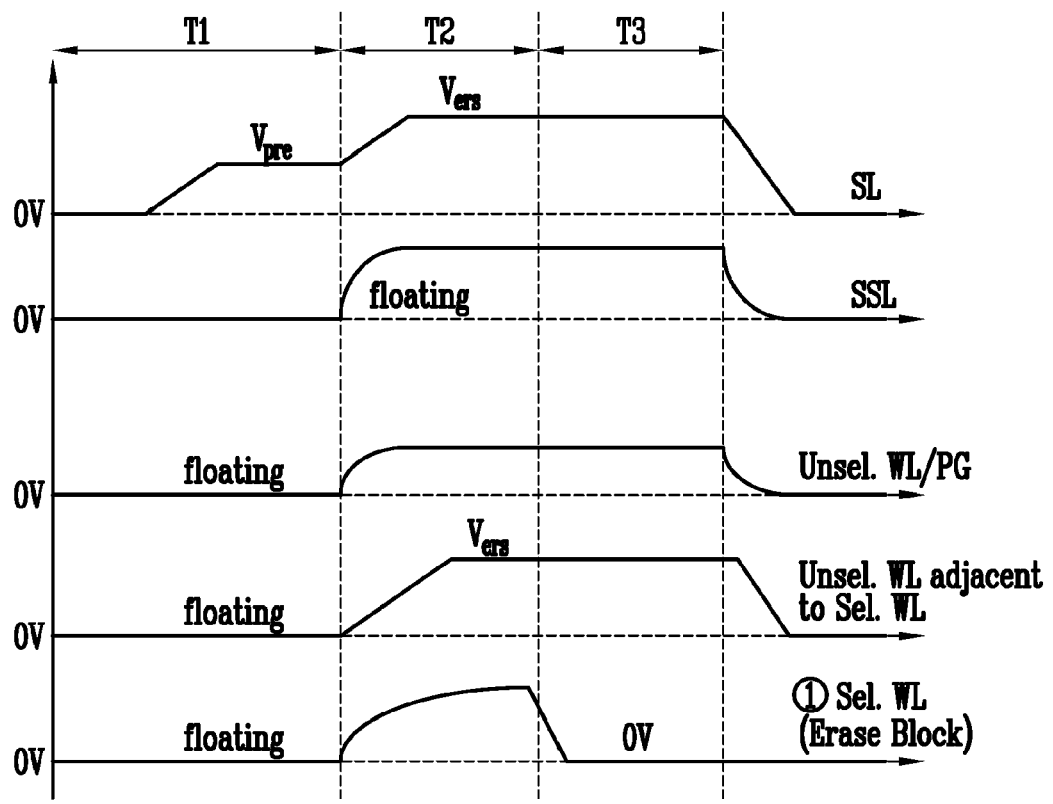

FIGS. 7A and 7B are diagrams for explaining an operation of a semiconductor memory device according to some embodiments. In particular, memory cells connected to selected word lines may be selectively erased. In this case, a logical size of a memory block on which an erase operation is to be performed may be adjusted to be smaller or larger than a logical size of the memory block on which a half block erase operation is to be performed. As shown in FIGS. 7A and 7B, to erase memory cells of a selected memory block, an erase command signal and an address signal may be applied. In response to the erase command signal and the address signal, an operation of supplying holes to a vertical channel layer may be performed during a first time period T1. The first time period T1 may be performed in the same manner as the first time period T1 described with reference to FIG. 4. However, a gate of a pipe transistor PT may be set to a floating sate along with word lines WL0 to WLn by peripheral circuits 120 to 140.

When sufficient holes are supplied to the vertical channel layer, during a second time period T2, peripheral circuits 120 to 140 may set a source select line SSL to the floating state, and apply an erase voltage $V_{ers}$ to a common source line SL. Voltages of the source select line SSL and the word lines WL0 to WL15, which may be set to the floating state, may rise to a level approximate to the erase voltage $V_{ers}$ due to a coupling effect.

Meanwhile, an erase voltage $V_{ers}$ may be applied by peripheral circuits 120 to 140 to unselected word lines WL2 and WL5 disposed adjacent to selected word lines WL3 and WL4 of memory cells designated as cells to be erased. In particular, during a third time period T3, peripheral circuits 120 to 140 may apply a ground voltage to the selected word lines WL3 and WL4 of the memory cells designated as the cells to be erased. As a result, the holes supplied to the vertical channel layer may be combined with electrons injected into the memory cells C3 and C4 due to a voltage difference between the erase voltage $V_{ers}$ and the ground voltage so that threshold voltages of the memory cells may be reduced, and the memory cells C3 and C4 may be erased.

When the voltages of the word lines WL3 and WL4, which are increased due to the coupling effect, are reduced to a ground voltage during the application of the erase voltage $V_{ers}$ in a floating state, voltages of the word lines WL2 and WL5 disposed vertically adjacent to each other may also drop due to the coupling effect. Referring back to Table 1, since parasitic capacitance between the vertically adjacent word lines is high, a fluctuation in voltage may increase due to the coupling effect. When the voltages of the unselected word lines WL2 and WL5 are reduced, electrons injected into cells C2 and C5, designated as cells not to be erased, may be combined with the holes of the vertical channel layer, so threshold voltages of the cells C2 and C5 may be reduced. Accordingly, to prevent the voltages of the unselected word lines WL2 and WL5 from dropping due to the coupling effect, before applying a ground voltage to the selected word lines WL3 and WL5, an erase voltage $V_{ers}$ may be applied to the unselected word lines WL2 and WL5 disposed adjacent to and above or below the selected word lines WL3 and WL5. When the erase voltage $V_{ers}$ is applied to the unselected word lines WL2 and WL5, since a voltage difference between the unselected word lines WL2 and WL5 and the vertical channel layer is small, the cells C2 and C5 may be prevented from being erased.

As described above, the erase voltage $V_{ers}$ may be selectively applied only to the word lines WL3 and WL4 of cells designated as cells to be erased, out of the word lines WL0 to WL15, so that the cells C3 and C4 to be erased can be selectively erased. Thus, a logical size of the memory block on which an erase operation is to be performed may be reduced, improving compatibility between a large memory block and the memory controller.

The method described in FIGS. 7A and 7B may be applied likewise to the select lines DSL and SSL, the word lines WL0 to WLn, and the common source line SL in the string structure described with reference to FIGS. 2A and 2B.

Figure 8:
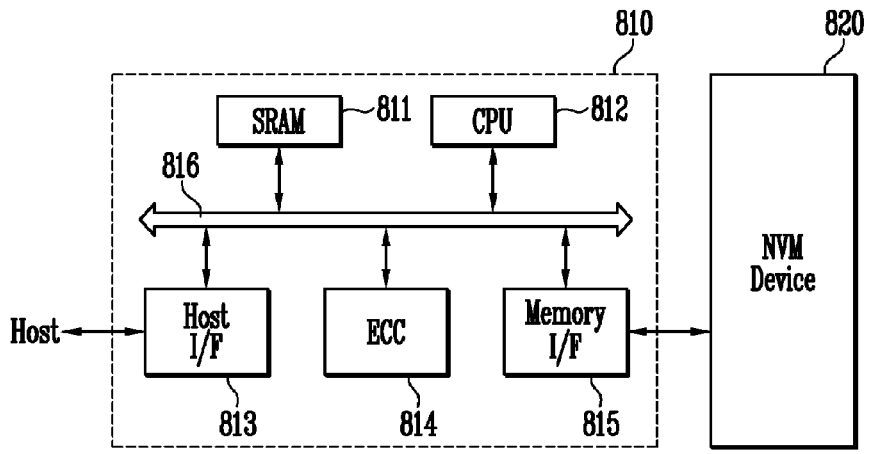
FIG. 8 is a schematic block diagram of a memory system according to some embodiments.

FIG. 8 is a schematic block diagram of a memory system 800 according to some embodiments. As shown in FIG. 8, the memory system 800 may include a non-volatile memory (NVM) device 820 and a memory controller 810.

The non-volatile memory device 820 may have the same configuration as the above-described semiconductor memory device illustrated in FIGS. 1, 2A, 2B, 3A, 3B, 5A, 6, and 7A and operate using the above-described methods. The memory controller 810 may be configured to control the non-volatile memory device 820. Also, the memory system 800 may be a memory card or solid-state disk (SSD) in which the non-volatile memory device 820 is combined with the memory controller 810. A static random access memory (SRAM) 811 may be used as an operation memory of a processing unit 812. A host interface 813 may include a data exchange protocol of a host connected to the memory system 800. An error correction code (ECC) block 814 may detect and correct errors included in data read from the non-volatile memory device 820. The memory interface 814 may interface with the non-volatile memory device 820 according to embodiments described herein. The processing unit 812 may perform general control operations so that the memory controller 810 can exchange data. According to some embodiments, SRAM 811, CPU 812, host interface 813, ECC block 814 and memory interface 815 may be coupled to a bus 816.

Although not shown in the drawings, memory system 800 may further include a read-only memory (ROM) configured to store code data required to interface with the host. The non-volatile memory device 820 may be a multi-chip package (MCP) including a plurality of flash memory chips. Consistent with some embodiments, memory system 800 may be provided as a highly reliable storage medium having a low error rate. In particular, memory system 800 may be a flash memory device that may be applied to a memory system, such as a solid-state disk (SSD). In such embodiments, the memory controller 810 may communicate with the outside (e.g., the host) through one of various interface protocols, such as a universal serial bus (USB), man machine communication (MMC), a peripheral component interconnect-express (PCI-E), a serial advanced technology attachment (SATA), a parallel advanced technology attachment (PATA), a small computer system interface (SCSI), an enhanced small device interface (ESDI), and intelligent drive electronics (IDE).

Figure 9:
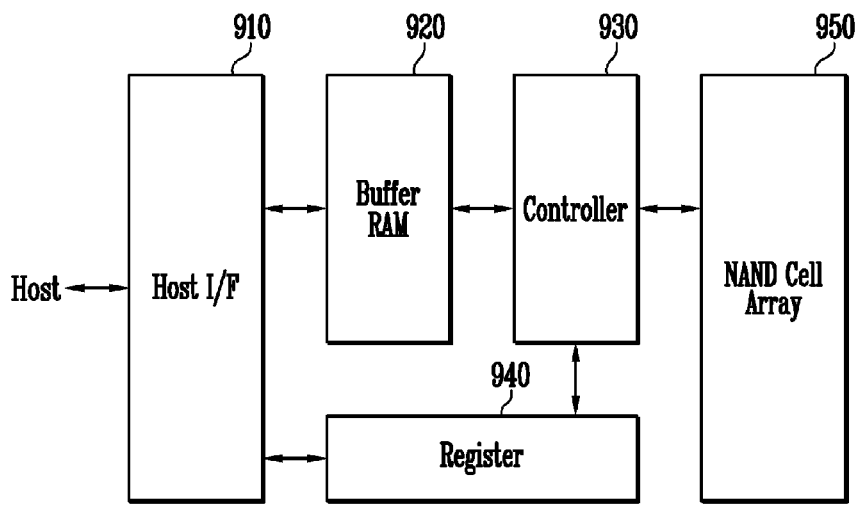
FIG. 9 is a schematic block diagram of a fusion memory device or fusion memory system configured to perform a program operation according to some embodiments.

FIG. 9 is a schematic block diagram of a fusion memory device or fusion memory system configured to perform a program operation according to some embodiments. Fusion memory devices, as used herein may refer to, for example a OneNAND flash memory device 900. Moreover, embodiments disclosed herein with respect to FIGS. 1, 2A, 2B, 3A, 3B, 4A, 4B, 5A, 5B, 6, 7A, 7B, and 8 may be applied to a OneNAND fusion flash memory device such as shown in FIG. 9.

The OneNAND flash memory device 900 may include a host interface 910 configured to exchange various pieces of information with apparatuses using different protocols, a buffer random access memory (buffer RAM) 920 configured to embed codes for driving the memory device 900 therein or temporarily store data, a controller 930 configured to control read and program operations and all states in response to externally input control signals and commands, a register 940 configured to store commands, addresses, and data (e.g., configuration for defining internal system operating circumstances of the memory device 900), and a NAND flash cell array 950 including non-volatile memory cells and an operating circuit including a page buffer. The memory array shown in FIG. 2 may be used as a memory array of the NAND flash cell array 950.

Figure 10:
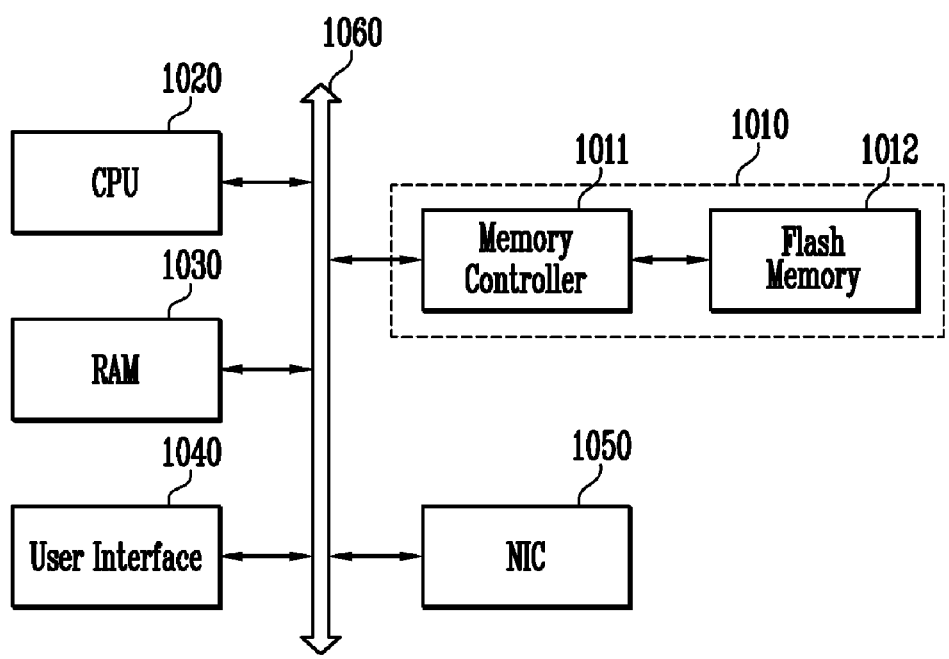
FIG. 10 is a schematic block diagram of a computing system including a flash memory device according to some embodiments.

FIG. 10 is a schematic block diagram of a computing system 1000 including a flash memory device 1012 according to some embodiments. As shown in FIG. 10, the computing system 1000 may include one or more processors (CPU) 1020, a RAM 1030, a user interface 1040, a network interface component (NIC) 150, which may correspond to, for example, a baseband chipset), and a memory system 1010, which may be electrically coupled to a system bus 1060. When the computing system 1000 is a mobile device, the computing system 1000 may further include a battery (not shown) configured to supply an operating voltage to the computing system 1000. Although not shown in FIG. 10, the computing system 1000 may further include an application chipset, a camera image processor (CIS), and/or a mobile dynamic RAM (DRAM). The memory system 1010 may include, for example, an SSD using a non-volatile memory to store data. Alternatively, the memory system 1010 may be a fusion flash memory (e.g., a OneNAND flash memory).

Embodiments provided herein may improve compatibility between a memory block and a memory controller by controlling a logical size of the memory block as an operation target.

In the drawings and specification, there have been disclosed various embodiments and, although specific terms are employed, they are used in a generic and descriptive sense only and not for purposes of limitation. It will be understood by those of ordinary skill in the art that various changes in form and details may be made therein without departing from the spirit and scope of the present disclosure. As such, the scope of this application is only limited by the following claims.

What is claimed is:

1. A method of operating a semiconductor memory device, comprising:
    applying an erase command signal and an address signal for erasing selected memory cells out of a plurality of memory cells, the plurality of memory cells being defined by word lines surrounding a vertical channel layer coupled between a bit line and a common source line at different heights from a semiconductor substrate;
    applying a precharge voltage to the common source line to supply holes to the vertical channel layer;

setting selected word lines of memory cells to be erased to a ground state; and applying an erase voltage to the common source line;

wherein applying the precharge voltage and the erase voltage comprise setting a gate of a pipe transistor formed in the semiconductor substrate to a floating state.

2. The method of claim 1, further comprising setting the word lines to the floating state before applying the precharge voltage to the common source line.

3. The method of claim 1, wherein the selected word lines are set to the ground state after applying the erase voltage to the common source line.

4. The method of claim 1, wherein applying the erase voltage to the common source line comprises maintaining, unselected word lines of memory cells not to be erased in the floating state.

5. The method of claim 1, wherein applying the erase voltage to the common source line comprises applying a positive voltage to an unselected word line disposed adjacent to and above or below the selected word line.

6. The method of claim 5, wherein the positive voltage includes the erase voltage.

7. The method of claim 1, wherein: applying a precharge voltage to the common source line comprises setting a source select line formed adjacent to the vertical channel layer to the ground state; and applying the erase voltage to the common source line comprises setting the source select line to the floating state.

8. The method of claim 1, wherein the vertical channel layer comprises a first vertical channel layer coupled between the common source line and the pipe transistor and a second vertical channel layer coupled between the bit line and the pipe transistor, and when first word lines surrounding the first vertical channel layer at different heights are changed from the floating state into the ground state, second word lines surrounding the second vertical channel layer at different heights are maintained in the floating state, and when the second word lines are changed from the floating state into the ground state, the second word lines are maintained in the floating state.

9. The method of claim 8, wherein after applying the erase voltage to the common source line, the first word lines are changed from the floating state into the ground state, or the second word lines are changed from the floating state into the ground state.

10. The method of claim 1, further comprising setting a source select line surrounding an upper end portion of the first vertical channel layer to the ground state when the precharge voltage is applied to the common source line, and setting a drain select line surrounding an upper end portion of the second vertical channel layer to the floating state when the erase voltage is applied to the common source line.

11. A semiconductor memory device comprising:
a memory block, the memory block comprising:
a bit line;
a common source line;
first and second vertical channel layers coupled between the bit line and the common source line, respectively;
a pipe transistor formed in a semiconductor substrate and connecting the first vertical channel layer to the second vertical channel layer;
word lines surrounding the bit line at different heights from the semiconductor substrate; and
memory cells formed in portions where the word lines surround the first and second vertical channel layers; and
one or more peripheral circuits configured to:

set the word lines to a floating state to supply holes to the first and second vertical channel layers when a precharge voltage is applied to the common source line; and set word lines of memory cells to be erased to a ground state when an erase voltage is applied to the common source line;

wherein at least one of the peripheral circuits is configured to set a gate of the pipe transistor to the floating state during the application of the precharge voltage and the erase voltage.

12. The device of claim 11, wherein the one or more peripheral circuits are configured to apply the precharge voltage to the common source line after setting the word lines to the floating state.

13. The device of claim 11, wherein the one or more peripheral circuits are further configured to set the selected word lines to the ground state after applying the erase voltage to the common source line.

14. The device of claim 11, wherein the one or more peripheral circuits are configured to maintain unselected word lines of memory cells not to be erased at the floating state when the erase voltage is applied to the common source line.

15. The device of claim 11, wherein the one or more peripheral circuits are further configured to apply a positive voltage to an unselected word line disposed adjacent to and above or below the selected word line when the erase voltage is applied to the common source line.

16. The device of claim 15, wherein the positive voltage includes the erase voltage.

17. The device of claim 11, wherein the memory block further comprises: a drain select line; and a source select line configured to respectively surround end portions of the first and second vertical channel layers, wherein the peripheral circuit sets the source select line to the ground state when the precharge voltage is applied to the common source line, and sets the source select line to the floating state when the erase voltage is applied to the common source line.

18. The device of claim 11, wherein:
the first vertical channel layer is connected between the common source line and the pipe transistor formed in the semiconductor substrate; and
the second vertical channel layer is connected between the bit line and the pipe transistor.

19. The device of claim 18, wherein when first word lines surrounding the first vertical channel layer at different heights are changed from the floating state into the ground state, the peripheral circuit maintains second word lines, which surround the second vertical channel layer at different heights, in the floating state, and when the second word lines are changed from the floating state into the ground state, the peripheral circuit is configured to maintain the second word lines in the floating state.

20. The device of claim 19, wherein after applying the erase voltage to the common source line, the peripheral circuit is configured to change the word lines from the floating state into the ground state, or change the second word lines from the floating state into the ground state.

21. The device of claim 18, wherein the memory block further comprises: a source select line surrounding an upper end portion of the first vertical channel layer; and a drain select line surrounding an upper end portion of the second vertical channel layer,
wherein the peripheral circuit is configured to set the source select line to the ground state when the precharge voltage is applied to the common source, and set the source select line to the floating state when the erase voltage is applied to the common source line.

\* \* \* \* \*